US006339342B1

(12) United States Patent
Yoshizawa

(10) Patent No.: US 6,339,342 B1
(45) Date of Patent: Jan. 15, 2002

(54) SEMICONDUCTOR DEVICE AND ELECTRONIC EQUIPMENT USING THE SAME

(75) Inventor: Masayuki Yoshizawa, Fujino-machi (JP)

(73) Assignee: Seiko Epson Corporation, Tokyo (JP)

(*) Notice: Subject to any disclaimer, the term of this patent is extended or adjusted under 35 U.S.C. 154(b) by 0 days.

(21) Appl. No.: 09/524,274

(22) Filed: Mar. 13, 2000

(30) Foreign Application Priority Data

Mar. 19, 1999 (JP) .......................................... 11-075283

(51) Int. Cl.[7] .......................................... H03K 19/0175

(52) U.S. Cl. .............................. 326/80; 326/63; 326/86

(58) Field of Search .............................. 326/80, 81, 83, 326/86, 63, 65, 68, 75

(56) References Cited

U.S. PATENT DOCUMENTS 4,420,743 A * 12/1983 Upadhyayula .............. 307/304
6,025,737 A * 2/2000 Patel et al. ................... 326/80
6,091,351 A * 7/2000 Shimomura ................. 326/68

* cited by examiner

*Primary Examiner*—Michael Tokar
*Assistant Examiner*—Don Phu Le
(74) *Attorney, Agent, or Firm*—Oliff & Berridge, PLC

(57) ABSTRACT

A semiconductor device can reduce the adverse effect of noise caused in a digital circuit, which is driven at a high drive frequency, on an analog circuit driven at a lower frequency. The semiconductor device comprises a power supply circuit provided with a voltage generation circuit, a first and second analog circuits, a digital circuit, and a level shifter. A first voltage VDD is supplied to the first analog circuit from a first terminal for driving the first analog circuit by a DC voltage. A voltage AVDD having the same potential as the first voltage VDD is supplied to the second analog circuit from a second terminal for driving the second analog circuit at a first drive frequency. A second voltage VD1 is supplied to a digital circuit from a voltage generation circuit of the power supply circuit for driving the digital circuit at a second drive frequency which is higher than the first frequency. The level shifter provided among the first and second analog circuits and the digital circuit shifts the level of signals which are input or output among the first and second analog circuits and the digital circuit.

9 Claims, 10 Drawing Sheets

SEMICONDUCTOR DEVICE AND ELECTRONIC EQUIPMENT USING THE SAME

BACKGROUND OF THE INVENTION

1. Field of the Invention

The present invention relates to a semiconductor device including both digital and analog circuits, and electronic equipment using such a semiconductor device. The present invention further relates to electronic equipment in which an amplification factor in the amplifier is variable, and to a semiconductor device to be used in such electronic equipment.

2. Description of the Related Art

There is a case that some semiconductor devices require both digital and analog circuits mounted thereon. Analog circuits include those driven at a DC voltage and those driven using sine curve oscillation signals with a specified frequency. On the other hand, digital circuits are driven at a drive frequency of several megahertz (MHz) because of high-speed operation. Thus, digital circuits are driven at a drive frequency significantly higher than analog circuits.

In such a semiconductor device, a digital circuit driven at a high drive frequency becomes a source of noise which adversely affects an analog circuit driven at a lower frequency.

In some analog circuits, signals input into a semiconductor device are amplified by an amplifier and passed through a filter, then the input signal levels are detected by comparing them with a reference potential using a comparator.

This type of semiconductor device has a problem in that the detection level cannot be easily varied by the users, requiring design modification of the semiconductor device.

SUMMARY OF THE INVENTION

An object of the present invention is, therefore, to provide a semiconductor device which can reduce an adverse effect of noise caused by digital circuits driven at a comparatively high frequency on analog circuits which are driven at a lower frequency, and can achieve reduction in size of digital circuits, and to provide electronic equipment using such a semiconductor device.

Another object of the present invention is to provide electronic equipment which has a function of detecting the levels of input signals using an amplifier and a comparator, and can easily modify the detection level without changing the reference potential in the comparator, and to provide a semiconductor device used in such electronic equipment.

In one aspect of the present invention, a semiconductor device comprises: a power supply circuit; and a plurality of functional blocks to each of which a voltage is supplied from the power supply circuit, wherein the power supply circuit has a voltage generation circuit for generating a second voltage by reducing a first voltage which is supplied from an external power supply source; and wherein at least one of the plurality of functional blocks comprises: an analog circuit to which the first voltage is supplied and which is driven at a first drive frequency; a digital circuit to which the second voltage is supplied and which is driven at a second drive frequency being higher than the first drive frequency; and a level shifter which is disposed between the analog circuit and the digital circuit and shifts a signal level which is input or output between the analog circuit and the digital circuit.

In this aspect of the present invention, a lower voltage than that supplied to the analog circuit is supplied to the digital circuit which is driven at a drive frequency higher than that of the analog circuit. Therefore, noise from the digital circuit which is a source of the noise is weakened and the adverse effect on the analog circuit is reduced.

When a signal is input or output between the analog circuit and the digital circuit which are driven at different voltages, signal levels can be shifted by the level shifter so that the signal levels conform to the drive voltage.

An input terminal of a grounding voltage supplied to the analog circuit may differ from an input terminal of a grounding voltage supplied to the digital circuit.

The use of different input terminals can reduce the adverse effect of noise on the analog circuit compared to the use of a common input terminal.

In the above-described aspect, the voltage resistance of transistors in the digital circuit can be lower than that in the analog circuit. Therefore, a channel length of a semiconductor transistor forming the digital circuit may be shorter than a channel length of a semiconductor transistor forming the analog circuit. This ensures reduction in the size of the digital circuit. In addition, a gate oxide film of a semiconductor transistor forming the digital circuit may be thinner than a gate oxide film of a semiconductor transistor forming the analog circuit.

The analog circuit and the digital circuit may respectively have two wiring layers consisting of an upper wiring layer and a lower wiring layer. The analog circuit and the digital circuit may respectively have a crossing section of the two wiring layers, the upper wiring layer of the analog circuit being disposed without crossing the upper wiring layer and the lower wiring layer of the digital circuit, and the lower wiring layer of the analog circuit being disposed without crossing the upper wiring layer and the lower wiring layer of the digital circuit. The adverse effect of noise can be reduced in this manner.

In another aspect of the present invention, a semiconductor device comprises: a power supply circuit; and a functional block to which a voltage is supplied from the power supply circuit, wherein the power supply circuit has a voltage generation circuit for generating a second voltage VD1 by reducing a first voltage VDD which is supplied from an external power supply source; and wherein the functional block comprises: a first analog circuit to which the first voltage VDD is supplied from a first terminal and which is driven at a DC voltage; a second analog circuit to which a voltage AVDD having the same potential as the first voltage VDD is supplied from a second terminal and which is driven at a first drive frequency; a digital circuit to which the second voltage VD1 is supplied from the voltage generation circuit and which is driven at a second drive frequency being higher than the first drive frequency; and a level shifter which is disposed among the first and the second analog circuits and the digital circuit for shifting signal levels which are input or output among the first and the second analog circuit and the digital circuit.

In this aspect of the present invention, a voltage lower than that supplied to the first and second analog circuits is supplied to the digital circuit which is driven at a drive frequency higher than the second analog circuit. Therefore, noise from the digital circuit which is a source of noise is weakened and the adverse effect of noise on the second analog circuit is reduced.

When a signal is input or output among the first and the second analog circuits and the digital circuit which are respectively driven at different voltages, signal levels can be shifted by the level shifter so that the signal levels conform to the drive voltage.

The semiconductor device according to this aspect further comprises a first terminal for inputting the voltage VDD into the first analog circuit and a second terminal for inputting the voltage AVDD to the second analog circuit. This makes it possible to use wiring for supplying the voltage AVDD different from the wiring for supplying the voltage VDD, and to make the former wire shorter than the latter wire. Providing separate wiring reduces the adverse effect of voltage fluctuation caused by the digital circuit side connected with the voltage VDD on the second analog circuit. In addition, because the impedance can be reduced by reducing the length of the wiring for supplying the voltage AVDD, it is possible to decrease the power supply voltage fluctuation (impedance×current) when a current flows through the wiring in the second analog circuit.

In this aspect of the present invention, an input terminal of the ground voltage VSS supplied to the first analog circuit and the digital circuit may differ from an input terminal of the ground voltage AVSS supplied to the second analog circuit. This makes it possible to use separate supply lines to grounding voltages and, at the same time, to reduce the impedance of the wiring for supplying the voltage AVSS. Consequently, an adverse effect of the digital circuit and a supply voltage fluctuation in the second analog circuit are decreased.

The use of the above-described semiconductor device in electronic equipment not only reduces occurrence of malfunctioning of the electronic equipment as an adverse effect due to noise can be reduced, but also ensures reduction in size of the electronic equipment because the semiconductor device can be densely integrated by miniaturizing digital circuits.

In further aspect of the present invention, electronic equipment comprises a semiconductor device which includes an amplification circuit and a comparing circuit which compares an output from the amplification circuit and a reference value to detect a signal of a specified level, wherein the amplification circuit has an input resistor and a feed back resistor connected thereto, and at least one of the input resistor and the feed back resistor is externally installed resister provided outside the semiconductor device.

This constitution allows the amplification factor of input signals to be varied by arbitrarily setting the amplification factor using the external resistor, while maintaining the reference voltage in the comparing circuit at a specified value. This consequently allows arbitrary change of the detection level in the comparator.

In this instance, the semiconductor device mounted on the electronic equipment may be capable of selecting one of two conditions in which: the semiconductor device incorporates the input resistor and the feed back resistor which are connected to the amplification circuits in one condition; and at least one of the input resistor and the feed back resistor is externally installed in the semiconductor device by a mask option in the other condition.

DESCRIPTION OF THE PREFERRED EMBODIMENTS

Embodiments of the present invention will be explained with reference to the drawings.

General description of semiconductor device

Figure 1:
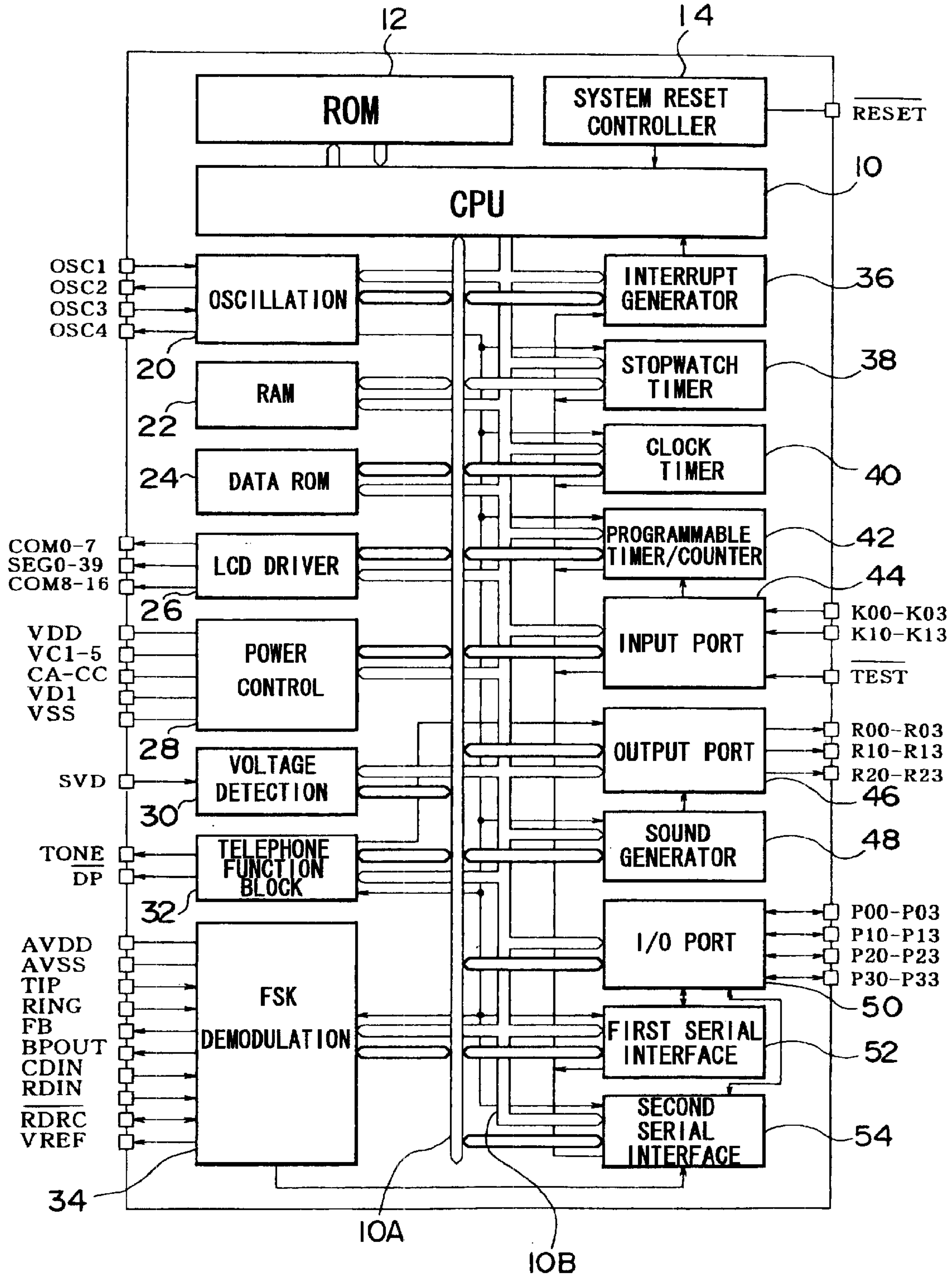
FIG. 1 is a block diagram of a semiconductor device according to an embodiment of the present invention.

FIG. 1 is a block diagram of a semiconductor device according to the present embodiment. The semiconductor device shown in FIG. 1 is of a type to be mounted on a telephone. In addition to a ROM 12 and a system reset controller 14, a CPU 10 is provided with a data bus 10A and an address bus 10B which are connected to various functional blocks will be mentioned below. Several functional blocks among these include analog circuits in addition to digital circuits. An analog circuit includes a circuit driven at a DC voltage and a circuit driven at a first drive frequency. A digital circuit is driven at a second drive frequency which is higher than the first frequency.

An oscillation circuit (OSC) 20 oscillates various drive frequencies which are necessary for digital circuits and analog circuits. The data which is necessary for the operation of the CPU 10 is stored in a RAM 22 and a data ROM 24. An LCD driver 26 drives an LCD panel set up in the telephone. A power control section 28 generates a voltage necessary for the semiconductor device based on the voltage supplied by the external power source. A voltage detection circuit (SVD) 30 detects the level of the first voltage VDD which is a power supply voltage. A telephone function block 32 is a circuit for performing various functions necessary for the telephone. A FSK (frequency shift keying) demodulation circuit 34 demodulates signals sent in a FSK system to 0 and 1 digital signals.

This semiconductor device further comprises an interrupt generator 36, a stopwatch timer 38, a clock timer 40, a programmable timer/counter 42, an input port 44, an output port 46, a sound generator 48, I/O port 50, and first and second serial interfaces 52 and 54.

Power supply circuit

Figure 2:
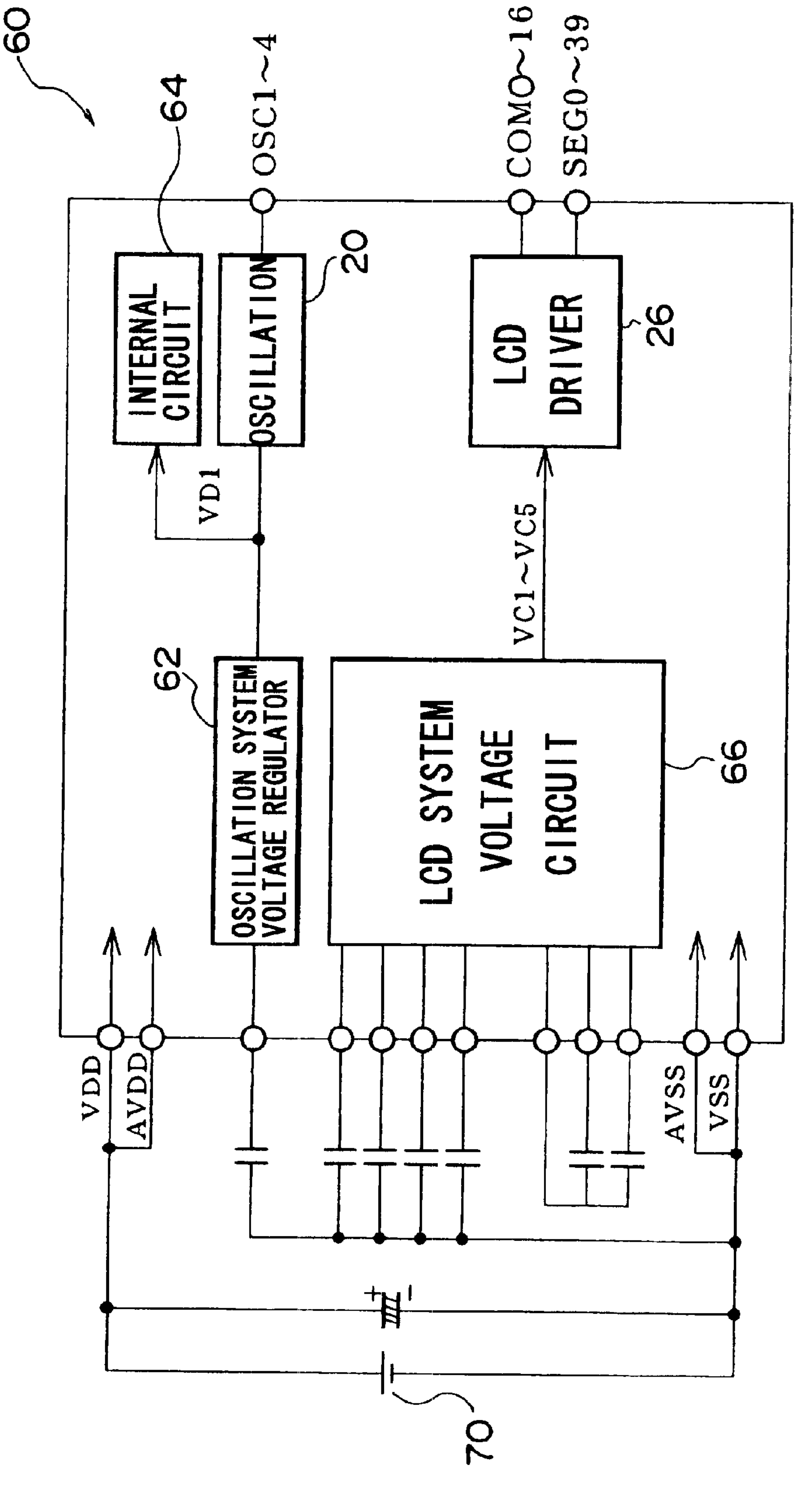
FIG. 2 is a block diagram of a power supply circuit of the semiconductor device shown in FIG. 1.

FIG. 2 is a block diagram of a power supply circuit 60 of the semiconductor device. In FIG. 2, voltages VDD and VSS are supplied to this semiconductor device from an external power supply source 70. The voltages AVDD and AVSS in FIG. 2 are voltages which are supplied to the analog section driven at the first drive frequency within the semiconductor device. These have the same potential as the voltages VDD and VSS, respectively, but are input respectively by an AVDD terminal and an AVSS terminal which differ from the VDD terminal and VSS terminal. This voltage VDD is supplied to an analog circuit driven at a DC voltage. The voltage VSS is supplied to an analog circuit driven in the DC voltage and to a digital circuit.

The oscillation system voltage regulator 62 provided in a power supply circuit 60 reduces the voltage VDD and generates the voltage VD1 (VD1<VDD). In the present embodiment, the voltage VDD is 5V and the voltage VD1 is 2 V, for example. The voltage VD1 is supplied to the internal circuit 64 and an oscillation circuit (OSC) 20 which are digital circuits. Two types of drive frequencies OCS 1, 2 and OCS 3, 4, for example, are formed in the oscillation circuit 20.

Figure 3:
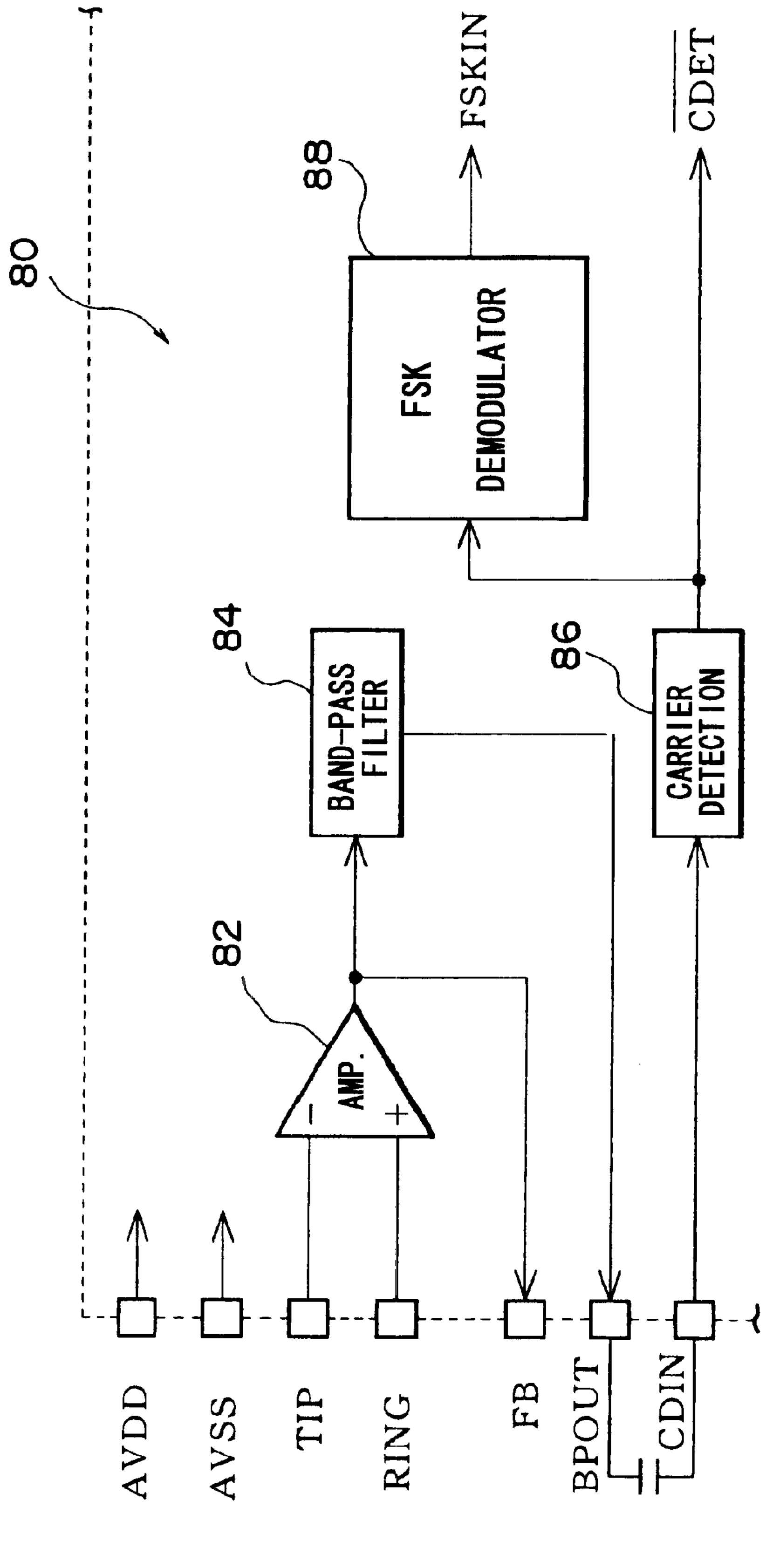
FIG. 3 is a block diagram of the FSK circuit of the semiconductor device shown in FIG. 1.

The LCD system voltage circuit 66 which is provided in the power supply circuit 60 produces liquid crystal drive voltages of 5 value levels, from VC1 to VC5, for example, based on the voltage VDD, and supplies these voltages to the LCD driver 26. FSK circuit FIG. 3 is a block diagram showing an example of part of an FSK core 80 in the FSK demodulation circuit 34. This FSK core 80 has an amplifier 82, a band-pass filter 84, a carrier detection circuit 86, and an FSK demodulator 88.

Figure 4:
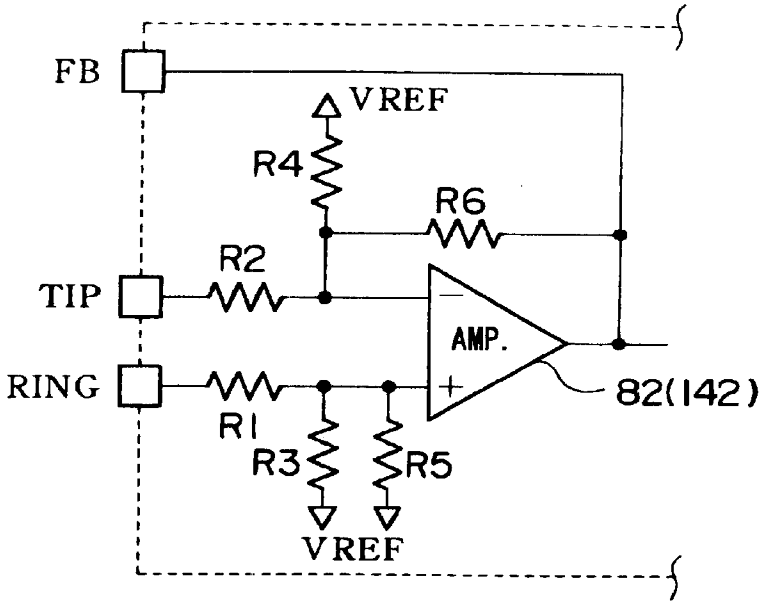
FIG. 4 is a drawing schematically showing a semiconductor device with a built-in resistor selected by a mask option.
Figure 5:
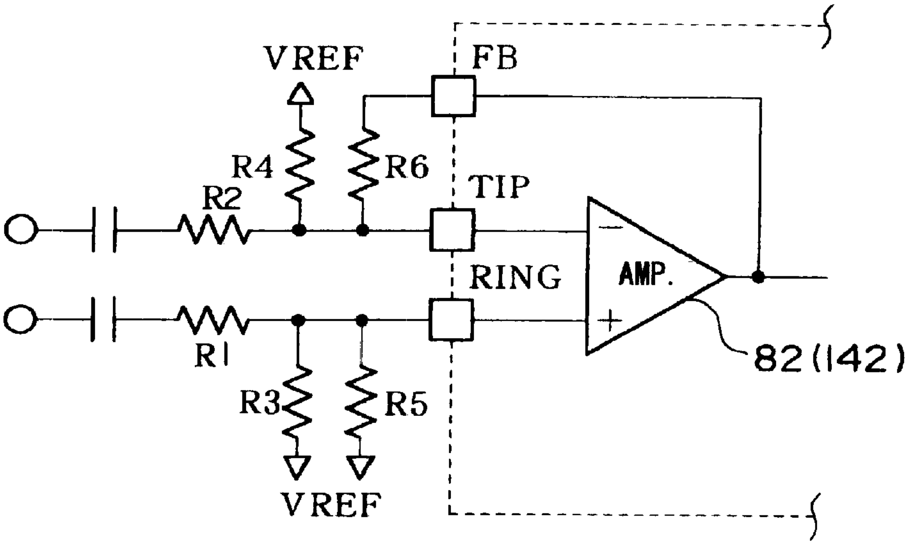
FIG. 5 is a drawing schematically showing an example of resistor connection when external installation is selected according to a mask option.

RING signals and TIP signals are respectively input from outside to the positive input terminal and negative input terminal of the amplifier 82. Users may select either a built-in-type or externally installed type for the input resistor and feed back resistor of this amplifier 82 according to a mask option as shown in FIGS. 4 and 5. In either case, the gain $G_{amp}$ of the amplifier 82 is set according to the formula, $$G_{amp}=R5/R1=R6/R2$$

wherein R1=R2, R3=R4, R5=R6.

In the case of FIG. 4, the gain $G_{amp}$ of the amplifier 82 is fixed, whereas in FIG. 5 gain $G_{amp}$ of the amplifier 82 may be variable because the user may arbitrarily select the value for an externally installed resistor.

Figure 6:
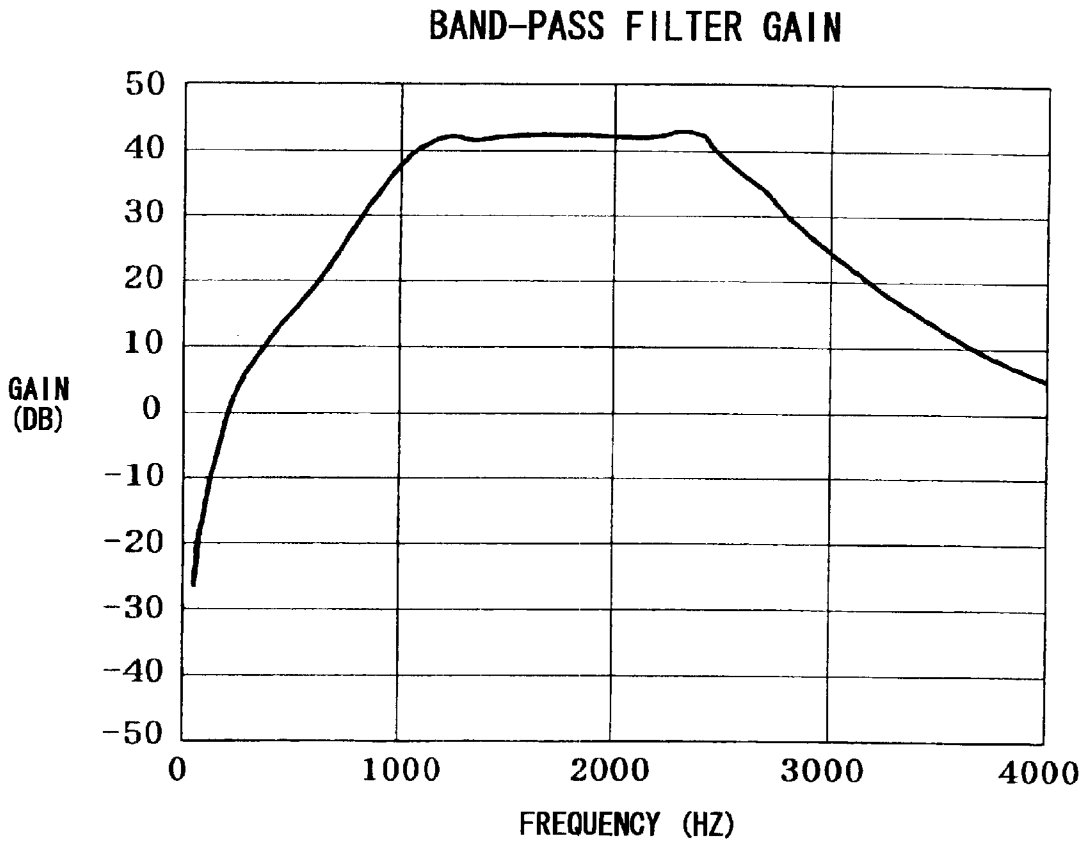
FIG. 6 is a drawing showing characteristics of the band-pass filter in the FSK circuit of FIG. 3.

The band-pass filter 84 has band-pass filter characteristics shown in the FIG. 6. A carrier detection circuit 86 detects whether a carrier signal is above a specific level based on the output of the band-pass filter 88. Although this detection level is fixed, the detection level may become variable as a consequence of the user's selection of the externally installed resistor as shown in the FIG. 5.

Figure 7:
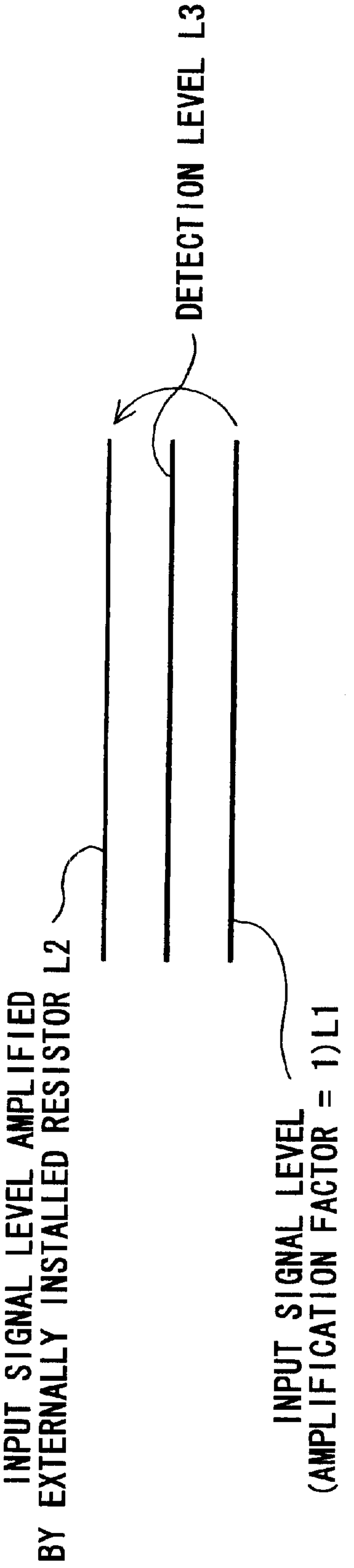
FIG. 7 is a drawing schematically showing the difference in the detection level of the circuits shown in FIG. 4 and FIG. 5.

This is explained referring to FIG. 7. In FIG. 7, signal levels L1, L2 are output by the amplifier 82. The level L1 is an output level of the amplifier 82 when a built-in input resistor and feed back resistor which are installed in the semiconductor device by baking a mask shown in FIG. 4 is used. Presume that the amplification factor in this case is 1, for example. The level L2 is an output level for the amplifier 82 when an input resistor and feed back resistor externally installed in the semiconductor device which are set by the user as shown in FIG. 5 is used. Presume that the amplification factor in this case is 1.2, for example. Accordingly, L2 has a higher signal level than L1.

At this time, presume that the detection level with the carrier detector 86 is L3 (for example, L1<L3<L2). In this case, the carrier detector 86 cannot detect the level L1, but can detect the level L2 as a level at least a specific level. In this manner, a detection level becomes variable as a consequence of the user's selection of an externally installed resistor.

Telephone function block

Figure 8:
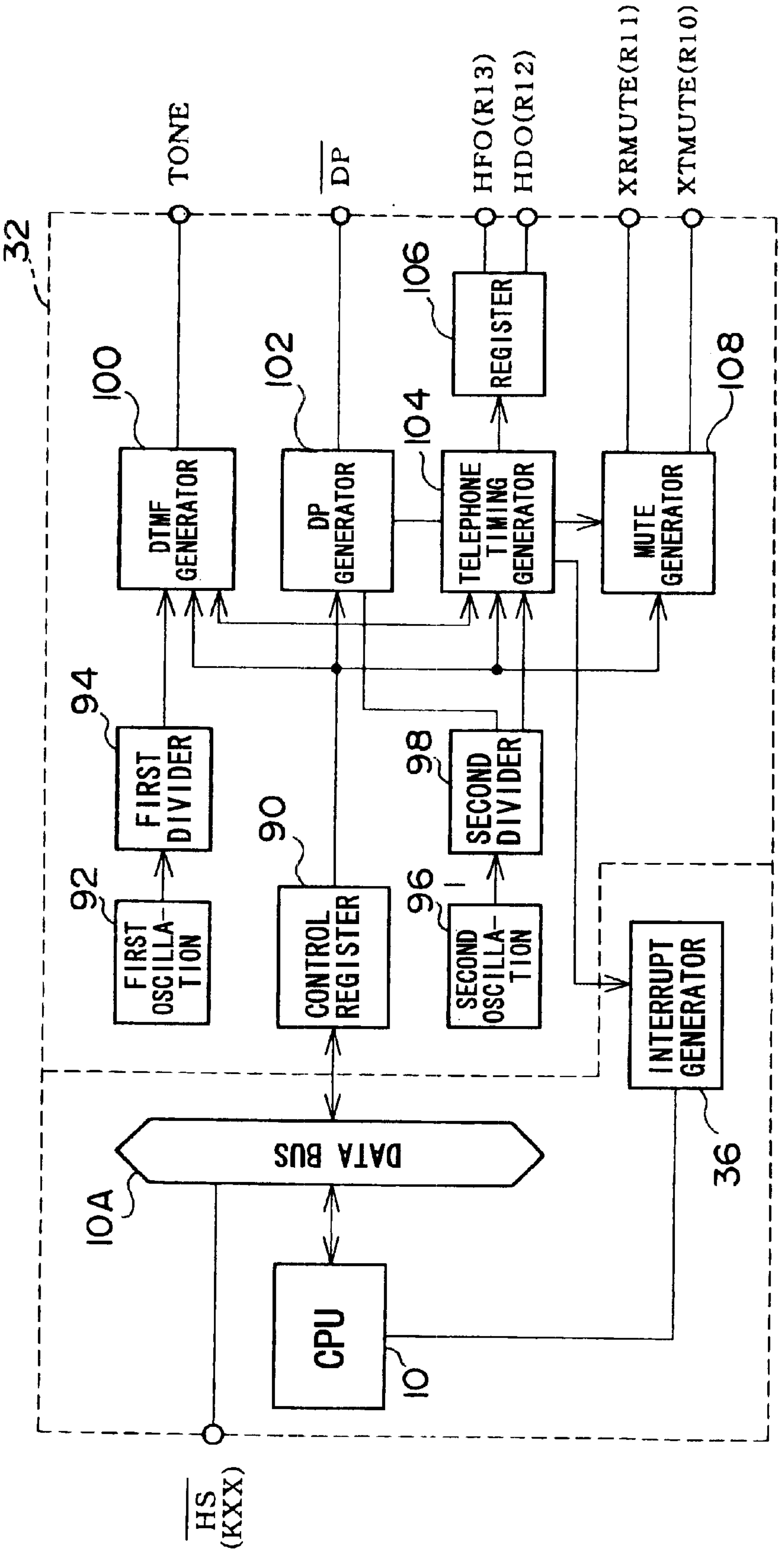
FIG. 8 is a block diagram of the telephone function block shown in FIG. 1.

FIG. 8 is a block diagram of the telephone function block 32 shown in FIG. 1. As shown in FIG. 8, in addition to a control register 90 connected with a data bus 10A of the CPU 10, the telephone function block 32 comprises a first oscillation circuit (3.58 MHz) 92, a first divider 94, a second oscillation circuit (32 MHz) 96, a second divider 98, a DTMF (dual tone multi-frequency) generator 100, a DP (dial pulse) generator 102, a telephone timing generator 104, a register 106, and a mute generator 108.

DTMF circuit

The telephone equipped with the semiconductor device of this embodiment can select either a tone mode or a pulse mode. The tone mode is a mode in which tone (pushbutton) signals "TONE" are output from the DTMF generator 100 in FIG. 8, whereas the pulse mode is a mode in which dial pulse signals "DP" are output from the DP generator 102 in FIG. 8.

In the case of the tone mode, the DTMF generator 100 in FIG. 8 outputs a frequency in which two types of frequencies, rows and columns, are synthesized when dial numbers 0 to 9 and marks "★" and "#" are manipulated as shown in the following Table 1.

TABLE 1

| Frequency | Column 1 (1209) | Column 2 (1336) | Column 3 (1477) |
|---|---|---|---|
| Row 1 (697) | 1 | 2 | 3 |
| Row 2 (770) | 4 | 5 | 6 |
| Row 3 (852) | 7 | 8 | 9 |
| Row 4 (941) | * | 0 | # |

Figure 9:
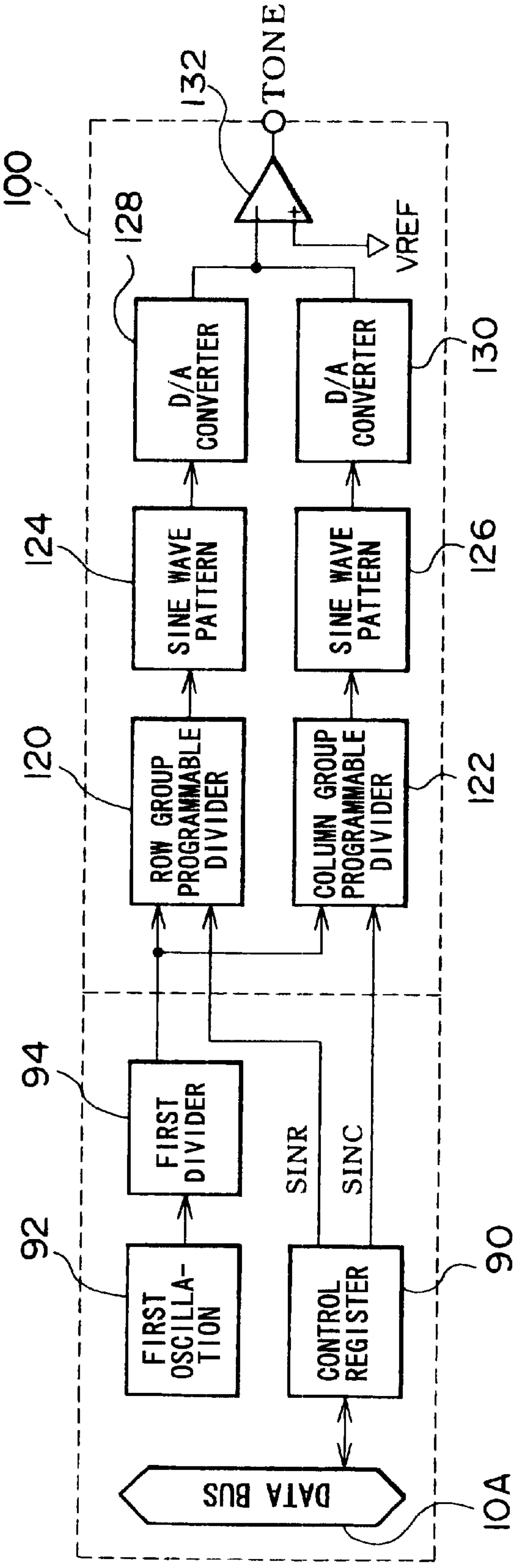
FIG. 9 is a block diagram showing the DTMF circuit provided in the telephone function block shown in FIG. 1.

FIG. 9 is a block diagram showing the DTMF circuit 100 provided with the telephone function block 32 shown in FIG. 1. In FIG. 9, the DTMF circuit 100 has a row group programmable divider 120 which produces the above-mentioned row frequency based on the frequency obtained by dividing the frequency of 3.58 MHz generated in the first oscillation circuit 92 using a divider 94, and a column group programmable divider 122 which produces the above-mentioned column frequency based on signals SINR and SINC input through the data bus 10A and the control register 90. Sine waves for row and column frequencies are output from sine wave pattern circuits 124 and 126 based on the output of dividers 120 and 122. These are subjected to digital-analog transformation by a D/A converters 128 and 130, synthesized, and amplified using an amplifier 132 to produce frequencies corresponding to each dial number and each mark.

CAS circuit

Figure 10:
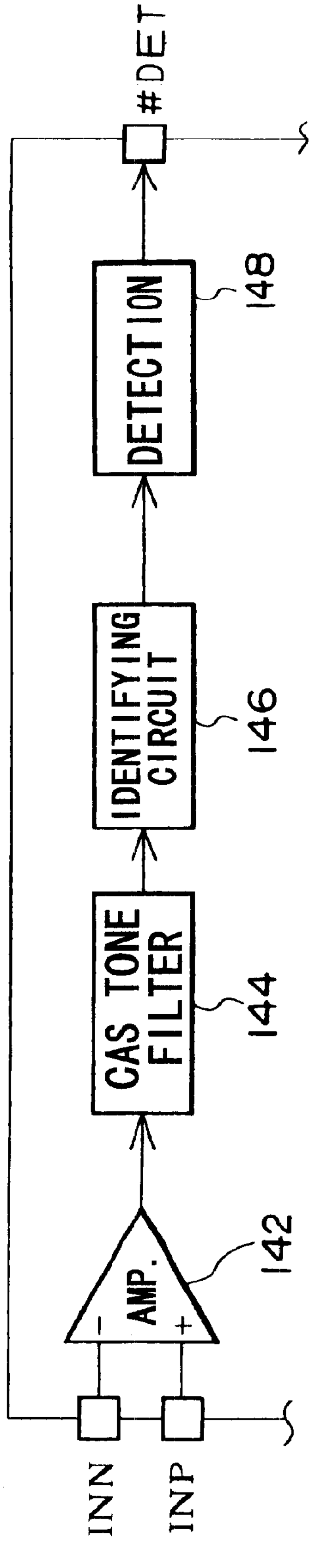
FIG. 10 is a block diagram of a CAS circuit which can be installed in the semiconductor device shown in FIG. 1.

FIG. 10 is a block diagram showing a CAS circuit 140 on which the semiconductor device of FIG. 1 can be mounted, which is not shown in the FIG. 1. In FIG. 10, the CAS circuit 140 has an amplifier 142, a CAS tone filter 144, an identifying circuit 146, and a detection circuit 148.

INP signals and INN signals are respectively input from external sources to the positive input terminal and negative input terminal of the amplifier 142. The signals amplified in the amplifier 142 are filtered through the CAS tone filter 144. In addition, signals identified as tone signals in the identifying circuit 146 are compared with the specified level in the detection circuit.

Users may select either a built-in-type or externally installed type for the input resistor and feed back resistor of this amplifier 142 as shown in FIGS. 4 and 5 in the same manner as in the FSK circuit of FIG. 3. In either case, using the reference characters of FIGS. 4 and 5 the gain $G_{amp}$ of the amplifier 142 is set according to the formula, $G_{amp}$=R5/R1=R6/R2 wherein R1=R2, R3=R4, R5=R6.

In the case of FIG. 4, the gain $G_{amp}$ of the amplifier 142 is fixed, whereas in FIG. 5 the gain $G_{amp}$ of the amplifier 142 may be variable because the user may arbitrarily select the value of the externally installed resistor.

Functional block having both digital and analog circuits

The FSK demodulation circuit shown in FIG. 3, DTMF circuit 100 shown in FIG. 9, and CAS circuit 110 shown in FIG. 10 have both digital and analog circuits therein.

In the FSK core 80 shown in FIG. 3, the amplifier 82 and band-pass filter 84 are analog circuits, and the carrier detection circuit 86 and FSK demodulator 88 have both analog and digital circuits.

In DTMF circuit 100 shown in FIG. 9, the row/column group programmable dividers 120, 122, and the sine wave pattern circuits 123, 126 are digital circuits. The D/A converter 128, 130 and the amplifier 132 are analog circuits.

In the CAS circuit 140 shown in FIG. 10, the amplifier 142 and the CAS tone filter 84 are analog circuits, and the identifying circuit 146 and the detection circuit 148 include both analog and digital circuits.

Figure 11:
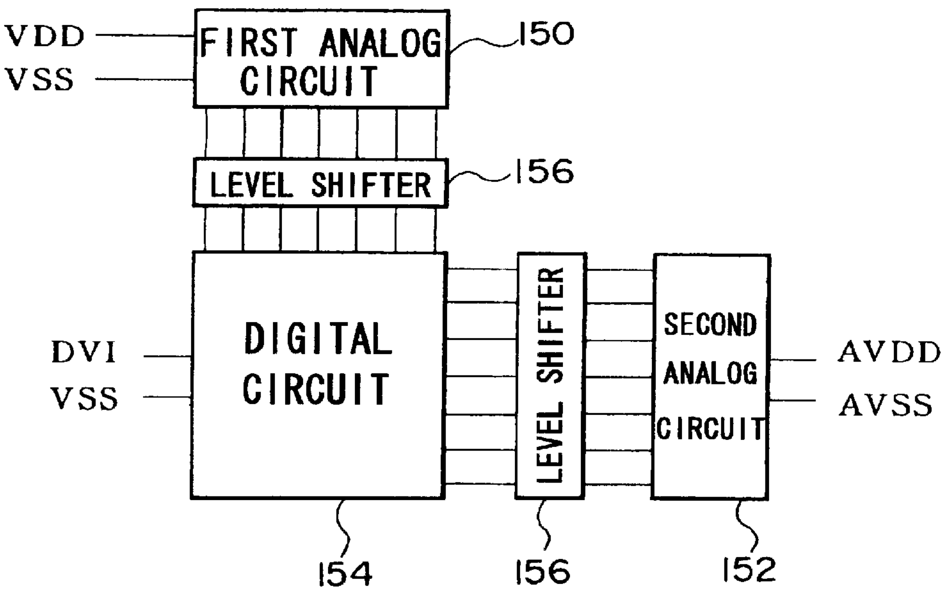
FIG. 11 is a drawing schematically showing functional block including both digital and analog circuits.

In this embodiment, the semiconductor device having both analog circuits and digital circuits is configured as shown in FIG. 11.

Specifically, FIG. 11 shows an example in which a first analog circuit 150, a second analog circuit 152, and a digital circuit 154 are included together in one functional block. Voltages VDD, VSS are supplied to the first analog circuit 150 to drive the circuit 150 by a DC voltage. Voltages AVDD, AVSS are supplied to the second analog circuit 152. In this embodiment, the second analog circuit 152 is driven at a first drive frequency of about 3 KHz which is within a voiceband. Voltages VD1, VSS are supplied to the digital circuit 152, which is driven at a second drive frequency of about 4 MHz, for example, which is higher than the first drive frequency.

These first and second analog circuits 150, 152, and the digital circuit 154 are disposed in separate areas in one functional block.

A level shifter 156, for shifting signal levels input or output among the first and second analog circuits 150, 152, and the digital circuit 154, is provided among the first and the second analog circuits 150, 152, and the digital circuit 154.

Signals from the digital circuit 152 driven at voltages VD1 and VSS shifted up their levels by the level shifter 156 and are supplied to the first and second analog circuits 150, 152. In contrast, the signals from the first and second analog circuits 150, 152, which are driven at voltages higher than the voltage driving the digital circuit 154, are shifted down by the level shifter 156 and are supplied to the digital circuit 154. Signals from the first and second analog circuits 150, 152 which output a high potential are not necessarily sent through the level shifter when the digital circuit 154 has sufficient voltage resistance.

Operational features of the semiconductor device

The semiconductor device having the above-mentioned configuration can decrease noise as compared with conventional semiconductor devices. The reasons are as follows.

Firstly, the digital circuit 154 driven at a second drive frequency which is significantly higher than the first drive frequency in the second analog circuit 152 is a noise source in this embodiment. However, the drive voltage VD1 in the digital circuit 154 which is a noise source is lower than the drive voltages AVDD, VDD in the first and second analog circuits 150 and 152. Therefore, the noise emitted from the digital circuit 154 is weakened, whereby an adverse effect on the second analog circuit 152 due to the noise can be decreased.

Secondly, the input terminal of the voltage AVDD supplied to the second analog circuit 152 which is driven at the first drive frequency and the input terminal of the voltage VDD supplied to the first analog circuit 150 which is driven at the DC voltage are separated.

The voltage VD1 supplied to the digital circuit 154 is produced by decreasing the power supply voltage VDD. As a consequence, the supply line to this voltage VD1 is conductive to the supply lines to the voltage VDD and the voltage AVDD.

The wiring from the input terminal of the voltage AVDD to the MOS transistor in the second analog circuit 152 can be formed independently by separately providing input terminals of the voltages AVDD and voltage VDD. In addition, it is possible to reduce the length of the independently formed wiring. Therefore, the impedance on the wiring to which the voltage AVDD is supplied can be smaller than the impedance on the wiring for the voltage VDD.

Because the impedance on the wiring to which the voltage AVDD is supplied is small, it is possible to decrease the voltage fluctuation (impedance×current) on the wiring when a specified current flows through the wire in the second analog circuit 152.

Moreover, because the wiring to which the voltage AVDD is supplied can be formed independently, the adverse effect of the voltage fluctuation on the digital circuit 154 side which is connected to the power supply voltage VDD on the second analog circuit 152 can be reduced.

The operation for decreasing noise and voltage fluctuations can also be achieved by providing separate input terminals for the voltage AVSS and the voltage VSS.

Transistor structures for digital and analog circuits

Figure 12:
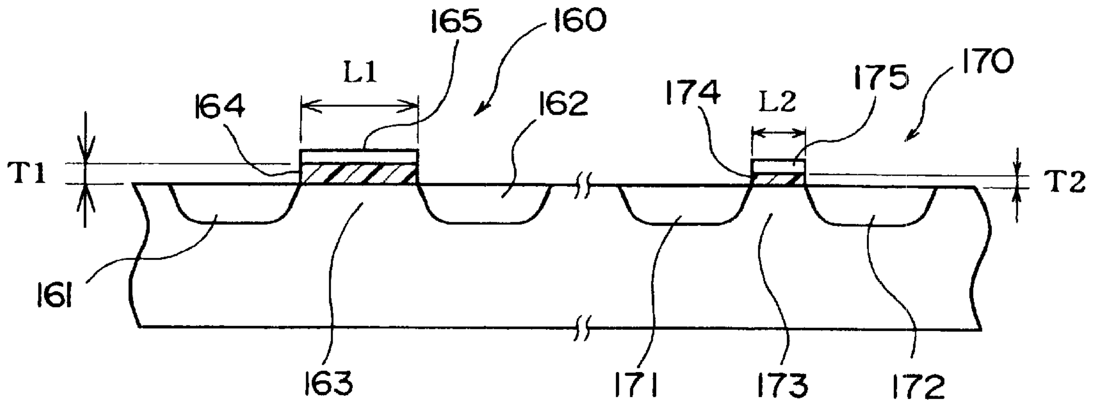
FIG. 12 is a cross-sectional view describing the structural difference in transistors between a digital circuit and an analog circuit.

FIG. 12 is a sectional view schematically showing a MOS transistor 160 disposed in the first and second analog circuits 150, 152, and a MOS transistor 170 disposed in the digital circuit 154.

As shown in FIG. 12, the MOS transistors 160 and 170 respectively have source regions 161, 171, drain regions 162, 172, channel regions 163, 173, gate oxide films 164, 174, and gates 165, 175.

Comparing the MOS transistor 160 and the MOS transistors 170, the MOS transistors 170 in the digital circuit 154 which is driven at a lower voltage VD1 may have less voltage resistance.

Therefore, the channel length L12 of the MOS transistor 170 is shorter than the channel length L1 of the MOS transistor 160. Although not shown in the Figures, the channel width W2 of the MOS transistor 170 can be shorter than the channel width W1 of the MOS transistor 160. As a result, the size of the digital circuit 154 can be reduced.

In addition, since the MOS transistor 170 may have less voltage resistance, the film thickness T2 of the gate oxide film 174 may be thinner than the film thickness T1 of the MOS transistor 160.

Although omitted from FIG. 12, the MOS transistor 160 in the first and second analog circuits 150, 152, and the MOS transistor 170 in the digital circuit 154 respectively have two wiring layers (upper wiring layer and lower wiring layer) made of aluminum, for example. The first and the second analog circuits and the digital circuit 154 respectively have a crossing section of the upper wiring layer and the lower wiring layer. However, the upper and the lower wiring layers of analog circuits, particularly the second analog circuit 152, are disposed so as not to cross the lower and the upper wiring layers of digital circuit 154. The adverse effect of noise in the digital circuit 154 on the analog circuit 152 can be reduced in this manner.

The present invention is not limited to the embodiments described above. Various modifications can be possible without departing from the spirit and scope of the present invention. For example, although a telephone as electronic equipment and a semiconductor device to be mounted on the telephone were used as examples in the above description, the present invention can be applied to any other semiconductor devices including both analog and digital circuits, and any electronic equipment using such semiconductor devices.

What is claimed is:

1. A semiconductor device comprising:

a power supply circuit; and a plurality of functional blocks to each of which a voltage is supplied from the power supply circuit, wherein the power supply circuit has a voltage generation circuit for generating a second voltage by reducing a first voltage which is supplied from an external power supply source; and wherein at least one of the plurality of functional blocks comprises:

an analog circuit to which the first voltage is supplied and which is driven at a first drive frequency;

a digital circuit to which the second voltage is supplied and which is driven at a second drive frequency being higher than the first drive frequency; and a level shifter which is disposed between the analog circuit and the digital circuit and shifts a signal level which is input or output between the analog circuit and the digital circuit.

2. The semiconductor device according to claim 1, wherein an input terminal of a grounding voltage supplied to the analog circuit differs from an input terminal of a grounding voltage supplied to the digital circuit.

3. The semiconductor device according to claim 1, wherein a channel length of a semiconductor transistor forming the digital circuit is shorter than a channel length of a semiconductor transistor forming the analog circuit.

4. The semiconductor device according to claim 1, wherein a gate oxide film of a semiconductor transistor forming the digital circuit is thinner than a gate oxide film of a semiconductor transistor forming the analog circuit.

5. The semiconductor device according to claim 1, wherein the analog circuit and the digital circuit respectively have two wiring layers consisting of an upper wiring layer and a lower wiring layer; and wherein the analog circuit and the digital circuit respectively have a crossing section of the two wiring layers, the upper wiring layer of the analog circuit being disposed without crossing the upper wiring layer and the lower wiring layer of the digital circuit, and the lower wiring layer of the analog circuit being disposed without crossing the upper wiring layer and the lower wiring layer of the digital circuit.

6. Electronic equipment comprising the semiconductor device as defined in claim 1.

7. A semiconductor device comprising:

a power supply circuit; and a functional block to which a voltage is supplied from the power supply circuit, wherein the power supply circuit has a voltage generation circuit for generating a second voltage VD1 by reducing a first voltage VDD which is supplied from an external power supply source; and wherein the functional block comprises:

a first analog circuit to which the first voltage VDD is supplied from a first terminal and which is driven at a DC voltage;

a second analog circuit to which a voltage AVDD having the same potential as the first voltage VDD is supplied from a second terminal and which is driven at a first drive frequency;

a digital circuit to which the second voltage VD1 is supplied from the voltage generation circuit and which is driven at a second drive frequency being higher than the first drive frequency; and a level shifter which is disposed among the first and the second analog circuits and the digital circuit for shifting signal levels which are input or output among the first and the second analog circuits and the digital circuit.

8. The semiconductor device according to claim 7, wherein an input terminal of the ground voltage VSS supplied to the first analog circuit and the digital circuit differs from an input terminal of the ground voltage AVSS supplied to the second analog circuit.

9. Electronic equipment comprising the semiconductor device as defined in to claim 7.

* * * * *